(12) United States Patent
Confalonieri et al.

(10) Patent No.: US 6,720,903 B2
(45) Date of Patent: Apr. 13, 2004

(54) METHOD OF OPERATING SAR-TYPE ADC AND AN ADC USING THE METHOD

(75) Inventors: Pierangelo Confalonieri, Caponago (IT); Marco Zamprogno, Cesano Maderno (IT); Francesca Girardi, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/172,376

(22) Filed: Jun. 14, 2002

(65) Prior Publication Data

US 2003/0231130 A1 Dec. 18, 2003

(51) Int. Cl.⁷ .............................. H03M 1/12; H03M 1/38
(52) U.S. Cl. ........................................ 341/172; 341/161
(58) Field of Search ................................. 341/172, 162, 341/139, 118, 120, 155, 156, 161; 324/678

(56) References Cited

U.S. PATENT DOCUMENTS 4,185,275 A  *  1/1980  Carbrey ....................... 341/162
5,621,409 A  *  4/1997  Cotter et al. ................. 341/156
6,268,813 B1 *  7/2001  de Wit .......................... 341/120
6,307,497 B1 * 10/2001  Leung et al. ................. 341/155
6,473,021 B1 * 10/2002  Somayajula et al. ........ 341/172
6,587,066 B1 *  7/2003  Somayajula ................. 341/172

* cited by examiner

Primary Examiner—Patrick Wamsley
(74) Attorney, Agent, or Firm—Lisa K. Jorgenson; E. Russell Tarleton; Seed IP Law Group PLLC

(57) ABSTRACT

A method of operating an SAR-type analog-to-digital converter to match the dynamic range of an input voltage signal to be converted with the full scale range of the converter, the converter including at least one array of binary weighted capacitors. The method includes the step of obtaining a digital gain code that represents the ratio between the full scale range and the dynamic range of the voltage signal to be converted, applying the voltage signal to be converted to the capacitor array so as to charge with the voltage signal to be converted only those array capacitors having the same binary weights as the bits of the gain code that have a selected binary value, and selectively coupling the capacitors of the array to one of a first and second predetermined reference voltage terminals according to an SAR technique, to obtain an output digital code corresponding to the input voltage signal.

7 Claims, 7 Drawing Sheets

METHOD OF OPERATING SAR-TYPE ADC AND AN ADC USING THE METHOD

BACKGROUND OF THE INVENTION

1. Field of the Invention

The present invention relates to a method of operating a successive approximation register (SAR) type analog-to-digital converter (ADC) and to an analog-to-digital converter configured to use the method.

2. Description of the Related Art

FIG. 1 shows a conventional SAR-type single-ended ADC 10 comprising an array of binary weighted capacitors, namely an array formed of N capacitors $C_0 \ldots C_j \ldots C_{N-1}$ with capacitances varying according to a factor $2^j$, where j varies from 0 to N-1. An additional capacitor $C_x$, with the same capacitance as the smallest capacitor ($C_0$) of the array, is provided to obtain an overall array capacitance which is exactly twice the capacitance of the largest capacitor ($C_{N-1}$) of the array. Each capacitor of the array has an electrode connected to a common node NS and another electrode connected, through a respective switch $S_{INj} \ldots S_{REFj} \ldots S_{GNDj} \ldots$, either to an input terminal 11 to receive a voltage $V_{IN}$ (referred to ground) to be converted, or to a first reference terminal to receive a first reference voltage $V_{REF}$ (referred to ground), or to a second reference terminal to receive a second reference voltage, in this example ground. The node NS is connected to the inverting input of an operational amplifier 20, which has a non-inverting input connected to ground and operates as a comparator. The output OUT of the operational amplifier is fed back to the inverting input through a switch $SW_R$. The comparator output OUT is also connected to a SAR control logic circuit 25. The SAR control logic circuit 25 has a first output terminal at which the digital output code is produced and further output terminals that provide binary control signals $B_0 \ldots B_j \ldots B_{N-1}$, $CARV_{IN}$ and $B_R$ to the drivers (broadly indicated DRV) of the switches $S_{INj} \ldots S_{REFj} \ldots S_{GNDj} \ldots$ and to the switch $SW_R$. An analysis of the logic gates which form the switch drivers DRV shows that switches $S_{REFj}$ and $S_{GNDj}$ are equivalent to a two-way switch which is opened or closed depending on the binary value of bit Bj to connect the capacitor Cj either to $V_{REF}$ or to ground. The binary signal $CARV_{IN}$ controls switch $S_{INj}$ to open or close a connection of capacitor Cj to $V_{IN}$ and inhibits the closure of both switches $S_{REFj}$ and $S_{GNDj}$ when switch $S_{INj}$ is on.

The operation principle is that typical of an SAR-type ADC. First, signal $B_R$ closes switch $SW_R$ to connect node NS to a virtual ground and signal $CARV_{IN}$ closes switches $S_{IN0} \ldots S_{INj} \ldots S_{INN-1}$ This causes all the array capacitors to be charged to the voltage $V_{IN}$ to be converted. Then, switch $SW_R$ is opened, so that node NS remains floating, and the SAR control logic 25 controls, through the binary signals $B_O$–$B_{N-1}$, the switches associated with the capacitors to selectively couple each capacitor of the array to either one of the first and second voltage reference terminals ($V_{REF}$, ground) according to the SAR technique. As a result of this operation step, node NS is brought to voltage:

$$V_{NS} = -V_{IN} + \sum_{j=1}^{N} \left(\frac{V_{REF}}{2^j}\right) \cdot b_j$$

where $b_j$ indicates the binary value of the j-th bit (associated with capacitor $C_j$ of the array). The operational amplifier 20 reads the sign of the voltage at node NS and outputs a corresponding digital signal. The control logic 25 is responsive to this digital signal to determine the value of the current bit of the output code and provides the capacitor array with a digital code for controlling the capacitor switches $S_{REFj}$, $S_{GNDj}$ in the subsequent operation step. After the last step, on the SAR control logic output there is the digital code (OutputCode) corresponding to $V_{IN}$.

A basic requirement for a correct design of a SAR-type ADC is a substantial equality of the dynamic range, i.e., the maximum swing of the voltage signal to be converted, and the Full Scale Range (FSR), i.e., the difference between the internal reference voltages ($V_{REF}$ and ground in the circuit of FIG. 1). If an optimum performance is required, the voltage signal to be converted should not be too high so as to be cut off, which would cause a conversion saturation error, and not too much lower than the FSR, otherwise the resolution of the converter would not be used at the best.

Usually, when the signal dynamic range is known, the designer implements a reference voltage generator capable of providing an FSR at least as large as the dynamic range.

This approach brings about two problems. First, the trend to the supply voltage reduction in the integrated circuit design and the requirement of providing a proper stable biasing of the operational amplifiers which generate the voltage references limit severely the maximum obtainable FSR. Second, it is often required to handle input voltage signals having different dynamic ranges. In this case, the FSR should be adjusted to each input dynamic range if the maximum resolution is to be obtained; this solution, however, is unpractical and generally difficult, if not impossible, in its implementation. Other known solutions keep a fixed FSR and provide networks for down-scaling the input signal before it is applied to the capacitor array, as shown in FIGS. 2 and 3.

FIG. 2 shows an ADC 10 identical to that of FIG. 1 with a down-scaling network 26 implemented with a simple resistor voltage divider. Four resistors $R_0$, $R_1$, $R_2$, $R_3$ are shown in series between an input terminal 27 and ground. The input terminal 27 and three taps of the divider can be selectively connected to the input terminal 11 of the converter 10 through a switch $SW_S$ controlled by a selection register 28. If the FSR at the input 11 of the converter 10 is known and the different dynamic ranges of the input signals are known, the divider can be easily designed to provide down-scaled replicas of the input voltage $V_{IN}$. A code stored in the selection register 28 makes it possible to select either the non-scaled input or one of the down-scaled replicas which best fit in each case. This solution has a number of disadvantages. First of all, the divider is a load for the generator of the signal to be converted, so that, this solution cannot be used with high impedance signal generators; furthermore, when usable, it causes an additional power consumption. In this case a compromise should be taken in selecting the overall resistance of the divider, since the overall resistance should be as high as possible to reduce power consumption, but should be low enough not to limit the charging speed of the capacitor array and therefore the conversion speed. In addition, an error component due to the noise associated with the resistor arrangement adds to the input signal, thereby reducing the accuracy and linearity of the converter. Finally, the difficulty in designing resistors which provide accurate scaling of the input signal and the integrated circuit area needed for the voltage divider should be also taken into account.

To avoid that a current is drawn from the generator of the signal to be converted, a scaling arrangement 26', as shown in FIG. 3, has been proposed. In this arrangement the input signal $V_{IN}$ is applied to the non-inverting input of an operation amplifier 29. A voltage divider comprising four resistors $R_0'$, $R_1'$, $R_2'$, $R_3'$ is connected as shown to the inverting input of the operation amplifier 29 through a switch $SW_S'$ controlled by a selection register 28'. A feedback resistor $R_F$ is connected between the output and the inverting input of operation amplifier 29. The input signal $V_{IN}$ can be down-scaled by changing the resistance between the inverting input and ground, and thus the gain of the operation amplifier, by means of a digital code stored in the selection register 28'. This arrangement has most of the disadvantages of the arrangement shown in FIG. 2 and additional problems related with the offset, noise and passband of the operation amplifier.

A further limitation of the solutions shown in FIGS. 2 and 3 is that the number of possible dynamic ranges is determined by the number of resistors of the voltage divider (typically 4 to 8), so that the user is not free to select the better dynamic range for his application, but is compelled to select one of the available dynamic ranges.

BRIEF SUMMARY OF THE INVENTION

An embodiment of the present invention provides an improved method of operating a SAR-type ADC to match the dynamic range of a voltage signal to be converted with the full scale range of the ADC without the limitations of the prior art converters.

The SAR-type analog-to-digital converter includes an array of binary weighted capacitors, and the method includes the steps of:

obtaining a digital gain code which represents the ratio between the full scale range and the dynamic range of the voltage signal to be converted, applying the voltage signal to be converted to the capacitor array, so as to charge with the voltage signal to be converted those array capacitors having the same binary weights as the bits of the gain code which have a selected binary value, and selectively coupling the capacitors of the array to either one of the first and second voltage reference terminals according to the SAR technique, to obtain an output digital code corresponding to the input voltage signal.

Another embodiment of the invention provides an SAR-type ADC that is operated according to the improved method.

The SAR-type analog-to-digital converter for converting an input voltage, referred to a common reference terminal, to an output digital code, comprises a reference voltage generator having a first and second reference voltage terminals, an array of binary weighted capacitors, each of said capacitors having a first electrode connected to a common node and a second electrode selectively connectable through respective controlled switching means to an input terminal at which the input voltage is applied, to the common reference terminal, or to either one of the first and second reference voltage terminals, a register for storing a digital gain code, control means coupled to the controlled switching means to open or close selectively the controllable switching means for connecting in a first step the capacitors of the array either to the input terminal or to the common reference terminal to charge to the voltage signal to be converted only those array capacitors having the same binary weights as the bits of the gain code which have a selected binary value and for connecting in a second step the array capacitors to either one of the first and second reference voltage terminals according to the SAR technique.

The features and advantages of the present invention will be more clearly understood from the following detailed description taken in conjunction with the accompanying drawings.

DETAILED DESCRIPTION OF THE INVENTION

Figure 1:
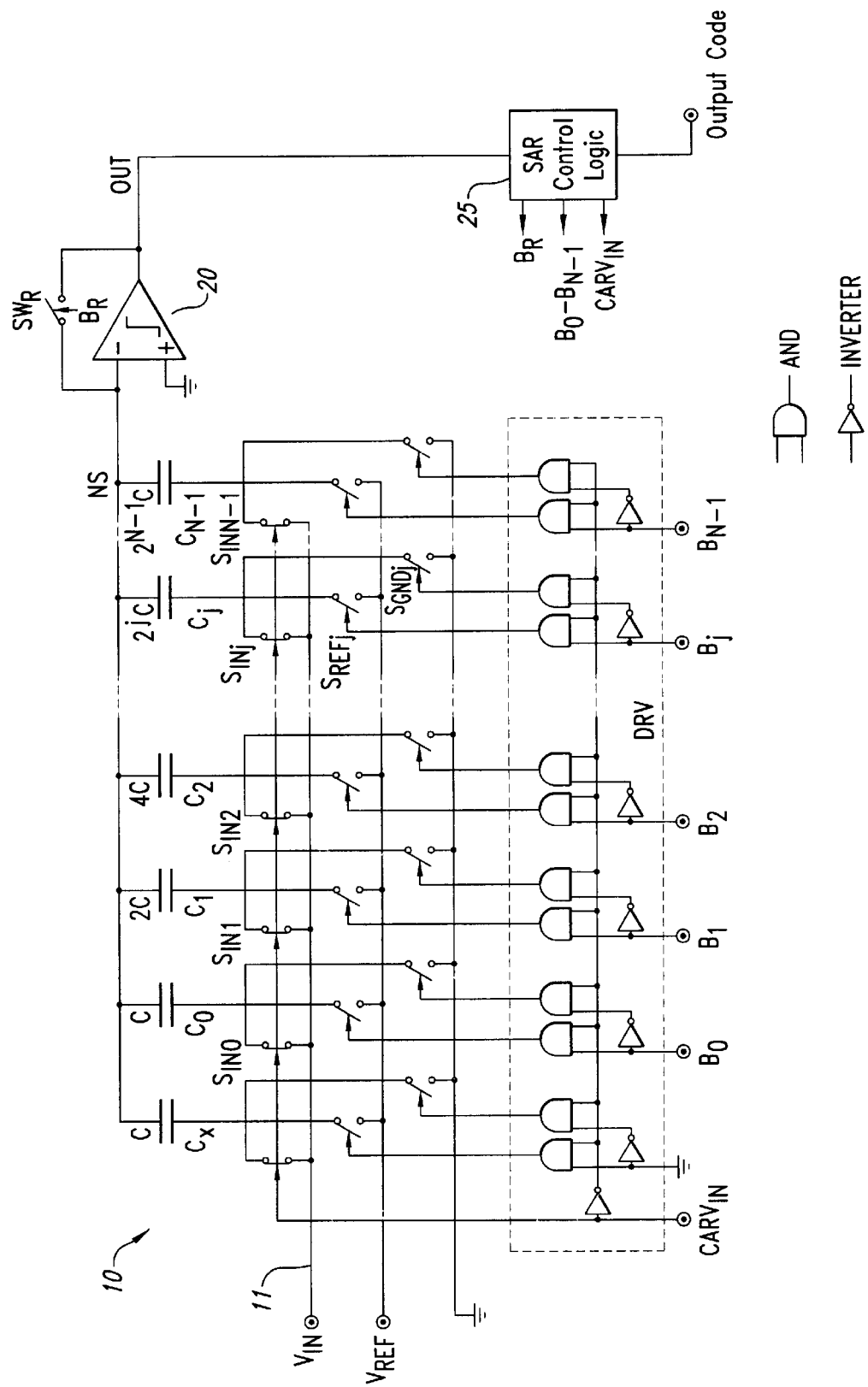
FIGS. 1–3 illustrate schematically three known ADCs.
Figure 2:
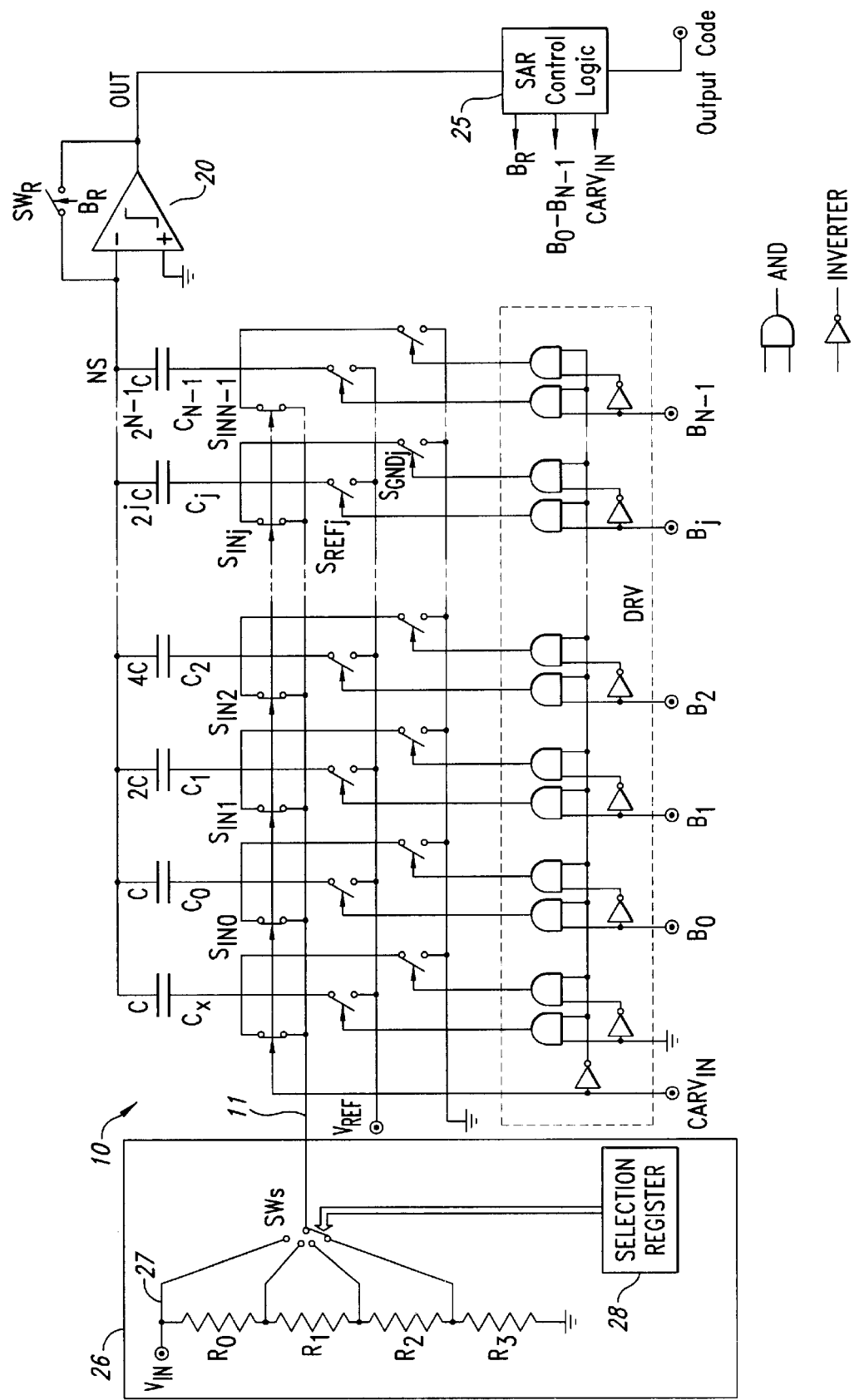
Figure 3:
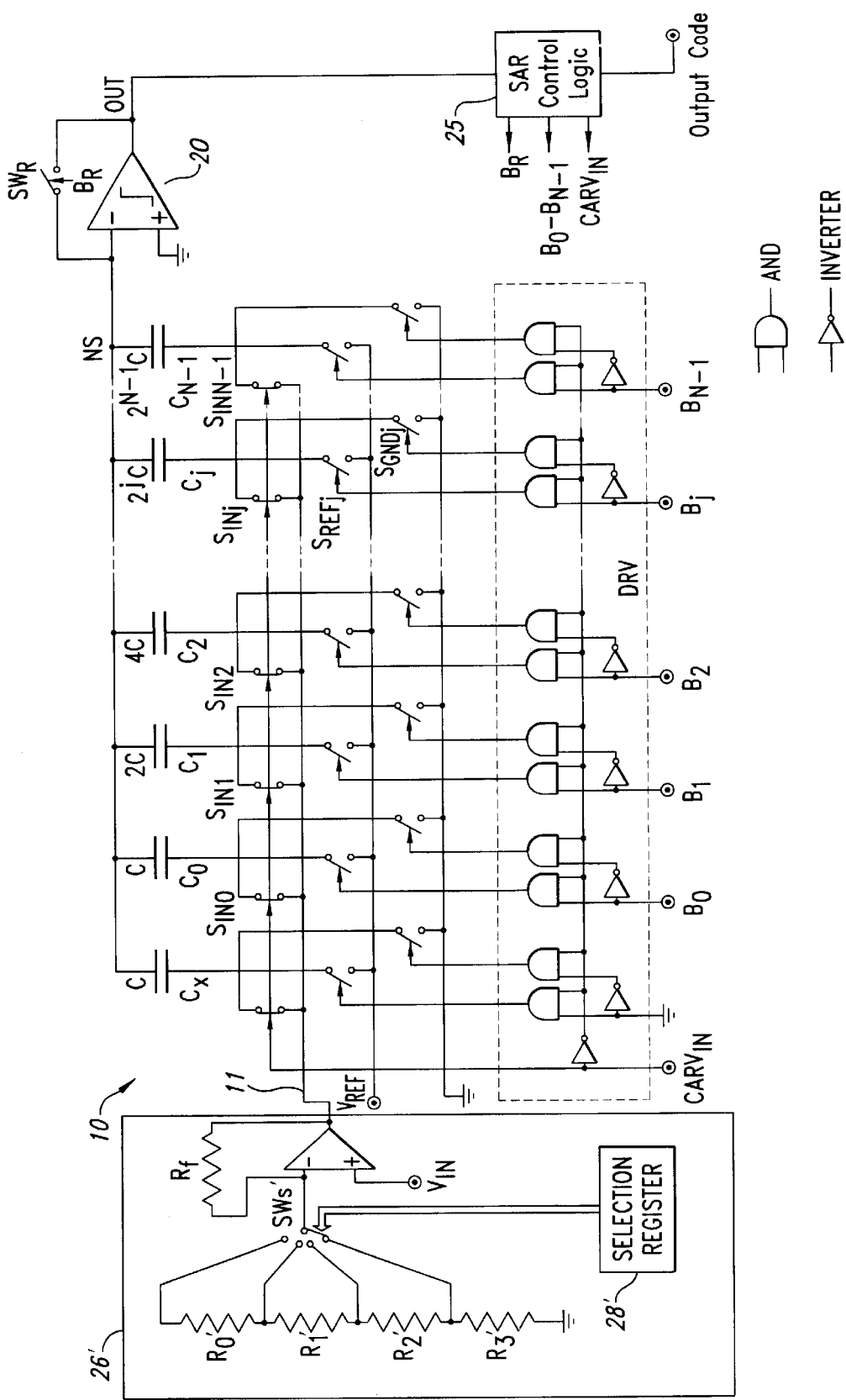
Figure 4:
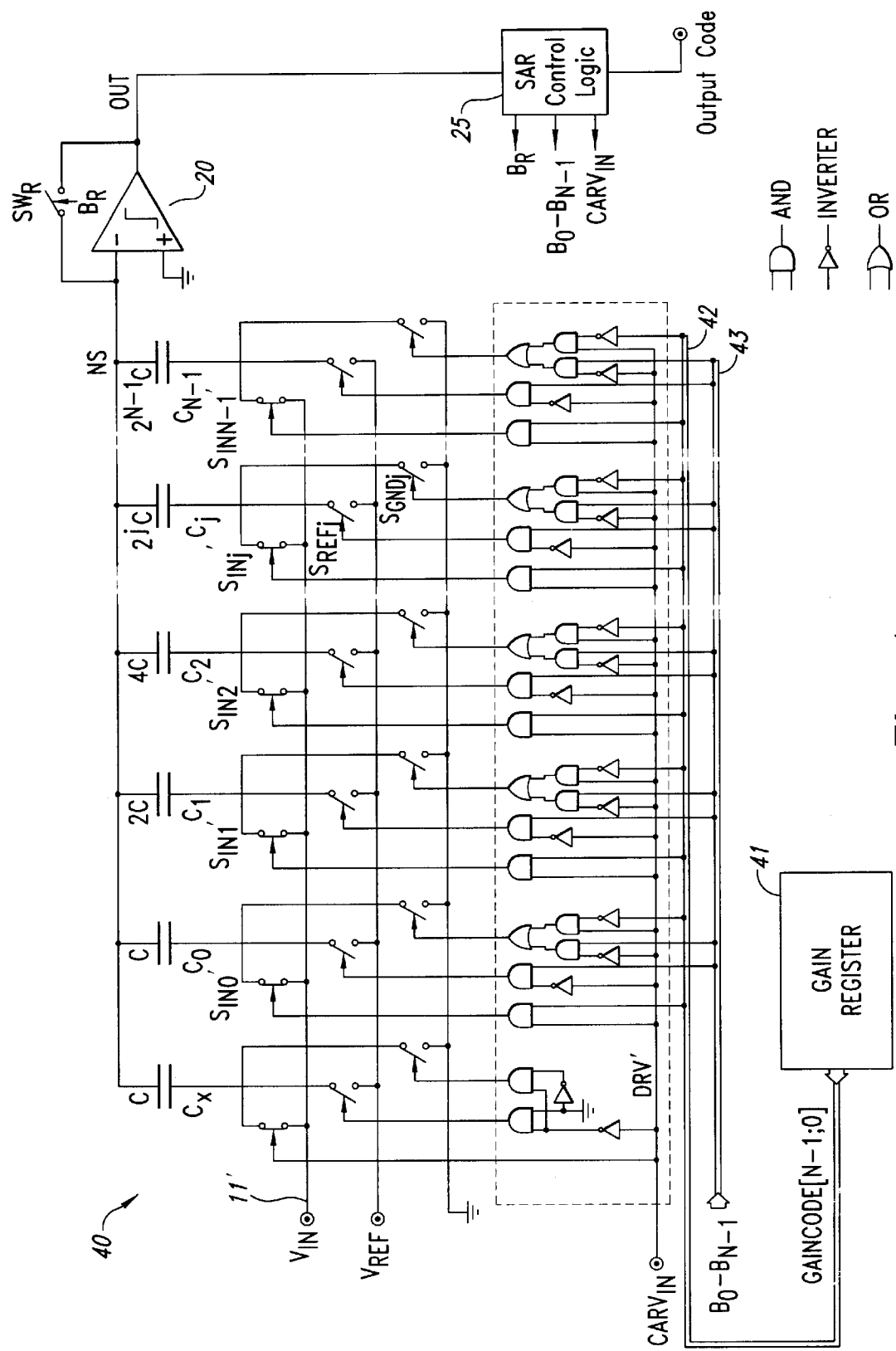
FIGS. 4 and 4A illustrate schematically two embodiments of an ADC according to the invention.

The converter according to the embodiment shown in FIG. 4, broadly indicated as 40, differs from the prior art converter of FIG. 1 for the addition of a gain code register 41, logic gates in the switch drivers, indicated DRV', and respective connections between the additional logic gates and an output bus 42 from the gain code register 41.

The gain code is a binary digital code which expresses the ratio between the full scale range (FSR) of the ADC and the dynamic range ($V_{INmax}$) of the input voltage signal to be converted and is obtained from the following expression:

$$GainCode = \text{bin}\left[\left(\frac{FSR}{V_{INmax}}\right) \cdot 2^N - 1\right] \quad (1)$$

where N is the resolution bit number of the converter and bin is the function which converts in binary form the real value in square brackets, previously approximated to the closest integer.

According to the invention, the gain code is used to selectively drive the switches $S_{IN0}' \ldots S_{inj}' \ldots S_{INN-1}'$ and $S_{GND0}' \cdot S_{GNDj}' \ldots S_{GNDN-1}'$ associated with the array capacitors during the charging step, i.e., the step of applying the voltage signal $V_{IN}$ to be converted to the capacitor array. Instead of connecting all the array capacitors to a common input terminal, as is terminal 11 in the prior art converter of FIG. 1, according to the invention only those capacitors of the array which have the same binary weights as the bits of the gain code with value "1" are connected to the input terminal 11'. The remaining capacitors of the array, which have the same binary weights as the bits of the gain code with value "0" are connected to ground through the respective switches $S_{GNDj}$.

Assume, for example, that FSR=1.5 V and $V_{INmax}$=2 V. If the capacitor array has a resolution of N=10, the gain code, as obtained from the expression (1), is 1011111111. This means that all the capacitors with the exception of capacitor $C_{N-2}$, i.e., the capacitor which codifies the bit $2^8$ and has a value $2^8 \cdot C$, are connected to the input terminal 11', while capacitor $C_{N-2}$ is connected to ground.

The switch drivers, according to the invention, are implemented so as to drive each capacitor of the array during the charging step independently and according to the gain code stored in the register 41. This requires the addition of logic gates in the switch drivers, as is clear from a comparison of FIGS. 1 and 4.

According to this embodiment of the invention, the gain code is first calculated and stored in the gain code register 41. The voltage signal $V_{IN}$ to be converted is then applied to the input terminal 11' of the array and the capacitors of the array are connected either to $V_{IN}$ or to ground, depending on the values of the bits with the same binary weights in the gain code. This operation logic should be clear from an analysis of the network formed by the logic gates of each switch driver. At the end of this charging step, the SAR control logic 25 supplies control signals $B_0$–$B_{N-1}$ to the switch drivers DRV' on a bus 43 to couple selectively all the capacitors to either $V_{REF}$ or to ground according to the usual SAR technique.

Figure 4A:
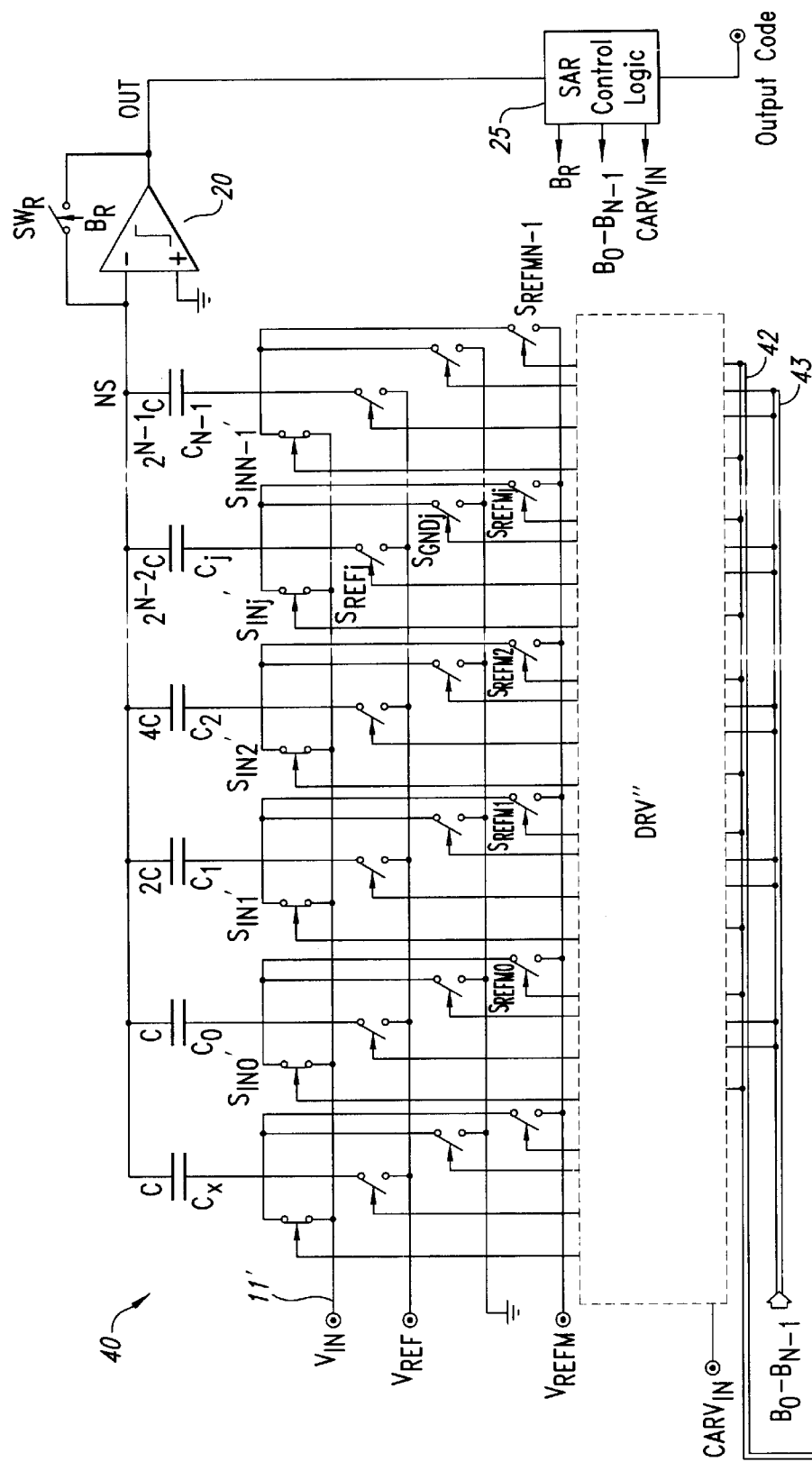

In the embodiment shown in FIG. 4 and described above it is assumed that both the input voltage $V_{IN}$ and the reference voltage $V_{REF}$ are referred to ground. However, in general, the input voltage and the reference voltage can be referred to different voltages. In this case an additional switch has to be associated with each capacitor of the array and additional logic gates have to be provided in the switch drivers to individually drive the switches of the array. Such an arrangement is shown schematically in FIG. 4A, where the same reference numerals and symbols are used to indicate the same components as in FIG. 4. In this example, the reference voltage $V_{REF}$ is referred to a voltage indicated $V_{REFM}$. Additional switches $S_{REFMo}$ ... $S_{REFMj}$ ... $S_{REFMN-1}$ are provided to selectively connect each capacitor of the array to an additional terminal at the reference voltage $V_{REFM}$. The switch drivers, broadly indicated by a box DRV", are not shown in detail to avoid unnecessary drawing complexity, but can be easily designed by a person skilled in the art of designing digital circuits.

The advantages of the invention should be clear from the explanation above. First, all the problems of power consumption, operation speed, noise and distortion are overcome because no dedicated scaling arrangement is required. Second, the down-scaling of the input signal can be effected with an accuracy equal to the converter resolution, so that any dynamic range of the input signal larger than the FSR can be down-scaled with a high accuracy. It should be noted that the additional integrated circuit area required is limited to the logic gates of the switch drivers and to a data bus (42 in FIG. 4) for the gain code. This additional bus can be omitted by a suitable implementation of a logic network for using a single bus in time sharing for the GAINCODE (N-1;0) and the control signals, or conversion code $B_0$–$B_{N-1}$, taking advantage of the fact that the gain code and the conversion code are never used simultaneously.

This embodiment of the invention brings about a further advantage, in that it can be implemented to correct any gain errors of the ADC. A gain error is the difference between the actual and the nominal FSR and is due to various manufacturing inaccuracies, such as offset, feed-through, and mismatches, which affect in particular the reference voltage generator. According to the invention, the gain error is corrected by properly adjusting the scaling factor, i.e., the digital code stored in the register 41.

Figure 5:
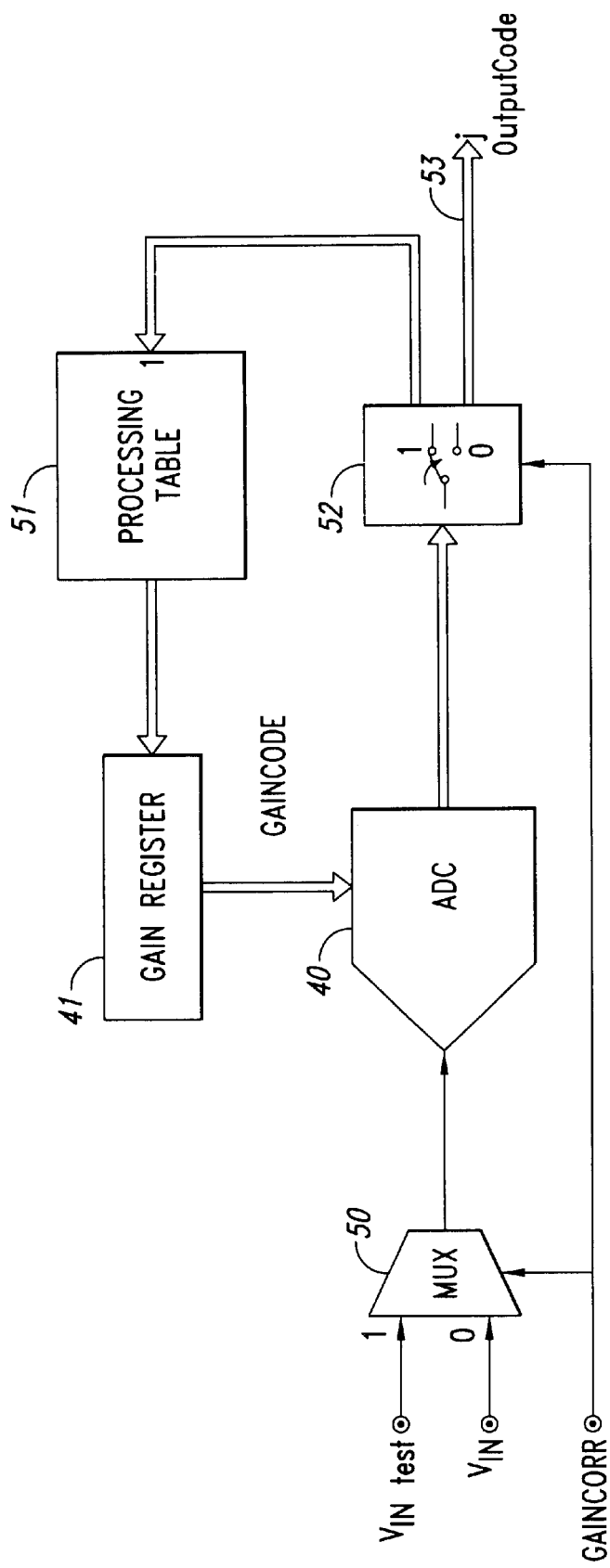
FIG. 5 illustrates schematically a portion of a third embodiment of an ADC according to the invention.

An example of this application is shown in FIG. 5. Assume that an ADC 40 according to the invention as shown in FIG. 4 is used to convert an input signal $V_{IN}$ having a known dynamic range. A default gain code, namely a nominal gain code calculated from a nominal FSR and the input dynamic range, is stored in a register 41. A test input signal $V_{INtest}$ having a known corresponding nominal digital code is input to the ADC 40 through a switching, or multiplexer MUX, unit 50. The multiplexer 50 and another switching unit 52 are controlled synchronously by a digital code GAINCORR from a system control unit (not shown) to couple the test input signal to the ADC input and to provide the converted actual digital code, output by the ADC, to a comparison and adjusting unit 51 for a short test time. The actual digital code obtained from the conversion during the test time is compared in the comparison and adjusting unit 51 with the nominal digital code to obtain a converter gain error. The nominal gain code stored in the register 41 is adjusted according to the converter gain error and used to operate the ADC as explained in connection with FIGS. 4 and 4A. Turning to the example described above where $V_{INmax}$=2 V, but with an actual FSR=1.4 V, instead of the nominal value 1.5 V, the resulting adjusted gain code, as obtained from the expression (1), would be 1011001100. In the case of a plurality of input dynamic ranges, the unit 51 could include a table with a list of correction codes, each corresponding to a different input dynamic range. At the end of the test time, the output code from the ADC is provided on an output bus 53 from switching unit 52.

Figure 6:
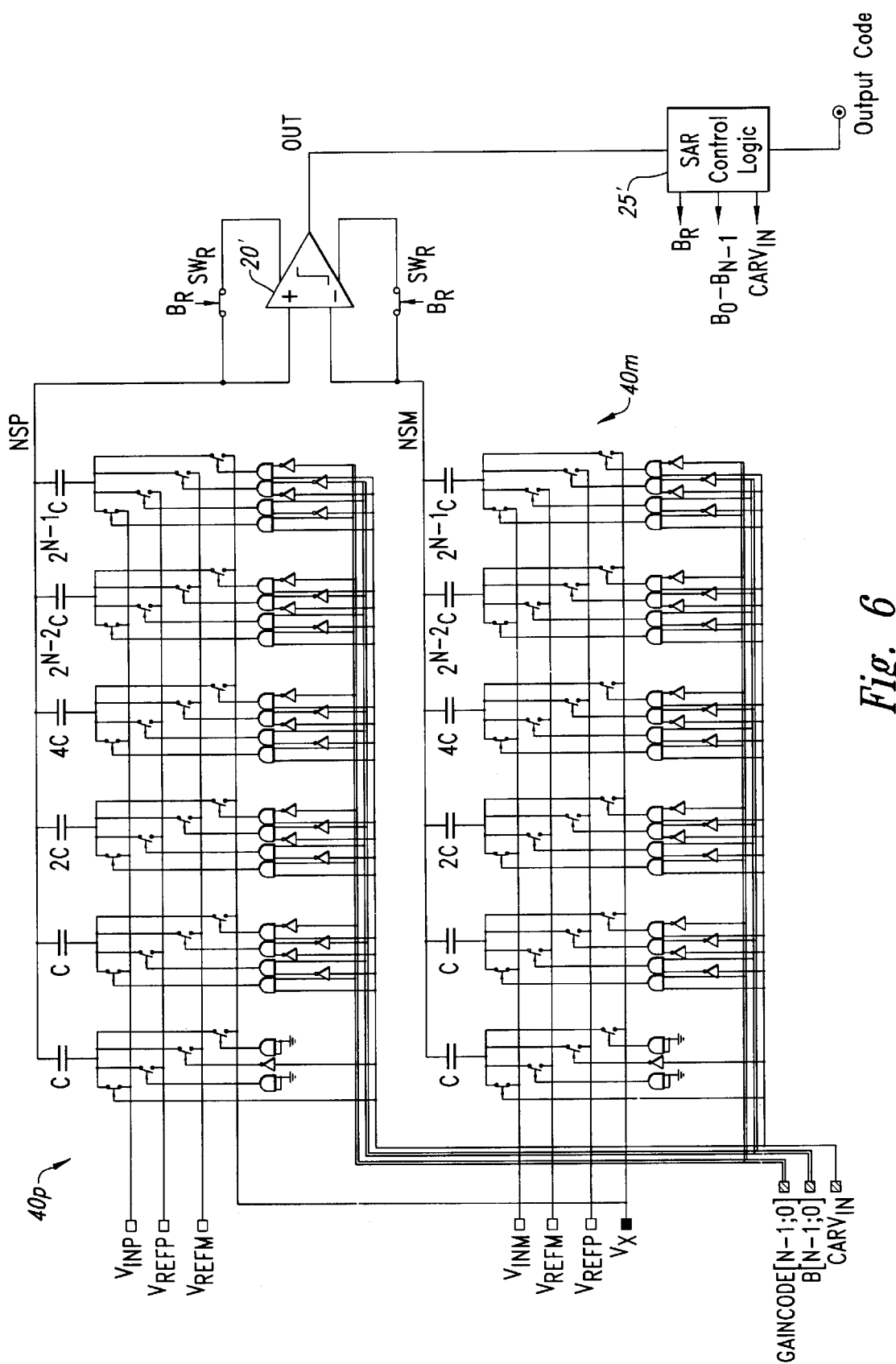
FIG. 6 illustrates schematically a fourth embodiment of an ADC according to the invention.

FIG. 6 is a schematic diagram of a differential SAR-type ADC. The differential ADC includes two identical circuit arrangements 40p and 40m, each comprising a capacitive array with respective switches and switch drivers. Differential inputs $V_{INP}$, $V_{INM}$, referred to a voltage $V_X$ and differential reference voltages $V_{REFP}$, $V_{REFM}$, are applied to the circuit arrangements 40p, 40m. The outputs from the arrangements 40p, 40m are coupled to a comparator 20' in the form of a differential amplifier. Two switches $SW_R$ are connected between the differential inputs and outputs, of the differential amplifier 20'. A SAR control logic unit 25'is connected to the comparator output and has an output terminal (OutputCode) and further output terminals that provide control signals $B_0$ ... $B_j$ ... $B_{N-1}$, $CARV_{IN}$ and $B_R$ for the arrangements 40p and 40m.

In the operation, first, when the signal $CARV_{IN}$=1, a charging step is carried out. More particularly, the capacitors of the upper array 40p having the same binary weights as the bits of the gain code which have the binary value "1" are coupled to the input voltage terminal $V_{INP}$, while the capacitors of the same array having the same binary weights as the bits of the gain code which have the binary value "0" are coupled to the reference voltage terminal $V_x$. At the same time, the capacitors of lower array 40m corresponding to the capacitors of the upper array 40p which are coupled, respectively, to $V_{INP}$ and to $V_x$ are coupled to the input voltage terminal $V_{INM}$ and to the terminal $V_X$, respectively. For example, if the i-th bit of GAINCODE is a 1, the i-th capacitor of the upper array 40p is coupled to $V_{INP}$ and the i-th capacitor of the lower array 40m is coupled to $V_{INM}$; and, if the j-th bit of GAINCODE is a 0, the j-th capacitors of both arrays are coupled to $V_X$. During the charging step the switches $SW_R$ are closed, the comparator 20' is in a reset condition and the common nodes NSP, NSM of the two arrays are forced to the reset common mode voltage of the comparator. At the end of the charging step, the signal $CARV_{IN}$ goes to 0, the switches $SW_R$ are opened, the common nodes NSP, NSM are floating and the capacitors are connected to either one of the differential reference voltage terminals $V_{REFP}$, $V_{REFM}$ in accordance with the logic of the successive approximation algorithm. The capacitors are connected in a dual mode, i.e., if a capacitor of the upper array is coupled to $V_{REFM}$, the corresponding capacitor in the lower array is coupled to $V_{REFP}$ and vice versa. An individual logic arrangement is shown for driving the switches of each capacitor of the arrays; however the same logic arrangement could be used for driving the switches of dual capacitors.

It should be understood that many different embodiments of the invention may be provided without departing from the spirit and scope of the invention. The invention, therefore, is not limited to the embodiments described above but is limited only by the appended claims and the equivalents thereof.

What is claimed is:

1. A method of operating an SAR-type analog-to-digital converter to match a dynamic range of an input voltage signal to be converted with a full scale range of the converter, the converter including an array of binary weighted capacitors, the method comprising the steps of:

obtaining a digital gain code which represents a ratio between the full scale range and the dynamic range of the voltage signal to be converted, the gain code comprising a binary digital code having bits with binary weights;

applying the voltage signal to be converted to the capacitor array, so as to charge with the voltage signal to be converted only those array capacitors having binary weights identical to the binary weights of the bits of the gain code that have a selected binary value; and selectively coupling the capacitors of the array to either one of first and second predetermined reference voltage terminals according to an SAR technique to obtain an output digital code corresponding to the input voltage signal;

wherein the binary digital code is generated from the following, expression:

$$GainCode = \text{bin}\left[\left(\frac{FSR}{V_{INmax}}\right) \cdot 2^N - 1\right] \quad (1)$$

where N is the resolution bit number of the converter,
bin is the function that converts in binary form the real value within the square brackets, previously approximated to the closes integer,
FSR is the full scale range of the converter, and
$V_{INmax}$ represents the dynamic range of the input signal voltage to be converted.

2. The method of claim 1 wherein the step of obtaining a gain code comprises the steps of evaluating a gain error as a difference between an actual full scale range and a nominal full scale range and correcting the gain code according to the evaluated gain error.

3. The method of claim 2 wherein the step of evaluating a gain error comprises the steps of converting a test analog signal having a corresponding nominal digital code to obtain a converted corresponding actual digital code and comparing the nominal digital code with the actual digital code to obtain the gain error from the comparison result.

4. A method of controlling a converter having an array of binary weighted capacitors, comprising:

generating a digital gain code having bits with binary weights corresponding to a ratio between a full scale range of the converter and a dynamic range of an input signal, wherein generating a digital rain code comprises generating a binary digital code by determining a ratio between the full scale range of the converter and the dynamic range of a voltage of the input signal, and wherein the binary digital code is generated from the following expression:

$$GainCode = \text{bin}\left[\left(\frac{FSR}{V_{INmax}}\right) \cdot 2^N - 1\right] \quad (1)$$

where N is the resolution bit number of the converter,
bin is the function that converts in binary form the real value within the square brackets previously approximated to the closes integer,
FSR is the full scale range of the converter, and
$V_{INmax}$ represents the dynamic range of the input signal voltage to be converted;

charging with the input signal only the array capacitors having the identical binary weight as the binary weights in the bits of the digital gain code; and coupling the array of capacitors to one of either a first voltage reference or a second voltage reference in accordance with a successive approximation register technique to generate an output digital signal responsive to the input signal.

5. The method of claim 4, comprising storing the in a digital code register.

6. The method of claim 5 wherein the step of generating a gain code comprises the steps of evaluating a gain error as a difference between an actual full scale range and a nominal full scale range and correcting the gain code according to the evaluated gain error.

7. The method of claim 4, comprising the step of evaluating a gain error, which comprises converting a test analog signal having a corresponding nominal digital code to obtain a converted corresponding actual digital code and comparing the nominal digital code with the actual digital code to obtain the gain error from the comparison result.

* * * * *

UNITED STATES PATENT AND TRADEMARK OFFICE
CERTIFICATE OF CORRECTION

PATENT NO. : 6,720,903 B2
DATED : April 13, 2002
INVENTOR(S) : Pierangelo Confalonieri et al.

It is certified that error appears in the above-identified patent and that said Letters Patent is hereby corrected as shown below:

Column 7,
Line 28, "the following, expression:" should read as -- the following expression: --

Column 8,
Line 9, "a digital rain code" should read as -- a digital gain code --.
Line 35, "storing the in ..." should read as -- storing the same in ... --.

Signed and Sealed this

Twentieth Day of July, 2004

JON W. DUDAS
*Acting Director of the United States Patent and Trademark Office*